METHOD OF EPITAXIALLY DEPOSITING SINGLE-CRYSTAL LAYER
AND STRUCTURE RESULTING THEREFROM
Filed Sept. 14, 1964

INVENTORS
EDWARD G. GROCHOWSKI
VINCENT J. LYONS

BY Everett A. Gartrell

ATTORNEY

United States Patent Office 3,523,046
Patented Aug. 4, 1970

3,523,046

METHOD OF EPITAXIALLY DEPOSITING SINGLE-CRYSTAL LAYER AND STRUCTURE RESULTING THEREFROM

Edward G. Grochowski, Wappingers Falls, and Vincent J. Lyons, Poughkeepsie, N.Y., assignors to International Business Machines Corporation, New York, N.Y., a corporation of New York Filed Sept. 14, 1964, Ser. No. 396,267
Int. Cl. H01l 7/36
U.S. Cl. 148—175 5 Claims

ABSTRACT OF THE DISCLOSURE

This disclosure is directed to a technique for epitaxially depositing single-crystalline semiconductor material on a semiconductor member and the resulting structure therefrom. In creating an epitaxial layer, the vapor of a compound which is used to deposit semiconductor material onto a substrate is intermittently introduced into the reaction chamber containing the substrate. In this manner, a substantially constant resistivity material is formed a few microns from the interface between the epitaxial layer and the substrate.

The present invention is directed to methods of epitaxially depositing a single-crystal semiconductor layer on a semiconductor member and the structure resulting therefrom. More particularly, the invention relates to methods of epitaxially depositing a single-crystal layer of silicon on a semiconductor member or substrate. The invention has particular utility in the fabrication of semiconductor devices and, hence, will be considered in that environment.

Planar and mesa semiconductor devices such as transistors which feature an epitaxial structure are being fabricated today in increasing quantities. A transistor employing such a construction includes a very low-resistivity single-crystal semiconductor substrate or parent body on which is deposited epitaxially a very thin single-crystal layer of fairly high-resistivity semiconductor material which is of the same conductivity type as the substrate and serves as the collector region of the device. Prior to the use of such an epitaxial layer, the substrate was a thick high-resistivity semiconductor body in order to assure a high collector-base breakdown voltage for the finished transistor. The use of a thin high-resistivity epitaxial layer on a low-resistivity substrate offers a number of important advantages in a transistor. The low-resistivity substrate reduces the collector bulk resistance and in turn the collector saturation resistance. Furthermore, such a substrate provides a region of low minority carrier lifetime so that the storage time of the transistor is reduced and its signal-translating speed is desirably increased. For some applications, the bulk resistance of the epitaxial layer together with that of the substrate may be as much as 5–10 times smaller than the collector bulk resistance of a conventional transistor. Moreover, the resistance of the epitaxially deposited collector layer can be increased if desired so that the collector-base breakdown voltage is higher and the collector capacitance is lower.

It will be seen from the foregoing remarks that semiconductor devices such as transistors employing an epitaxial layer possess a number of important advantages. However, in the fabrication of such devices, a severe problem exists in connection with the control of the resistivity of the epitaxial layer near the interface with the substrate. This is because of the entrance of the active impurity from the substrate into the growing epitaxial layer via a vapor phase mechanism. Briefly, difficulty is experienced in accurately controlling the impurity concentration profile of epitaxial layers in the fabrication of successive batches thereof on semiconductor substrates. As a result, subsequent diffusion operations for the purpose of establishing transistor base and emitter regions and associated junctions create dimensional problems with respect to the width of those regions and the locations of the junctions. These dimensional problems are acute when very high speed devices are being fabricated, the widths of the base and other regions of which must be extremely small in order to realize the necessary speeds.

It is an object of the invention, therefore, to provide a new and improved method of epitaxially depositing a single-crystal semiconductor layer on a semiconductor member having a resistivity greatly different from that of the layer.

It is another object of the invention to provide a new and improved method of epitaxially depositing a high-resistivity single-crystal semiconductor layer on a low-resistivity semiconductor member.

It is a further object of the invention to provide a new and improved method of epitaxially depositing a single-crystal semiconductor layer on a semiconductor member having a resistivity greatly different from that of the layer so as to establish in the layer a substantially constant resistivity as close as within 3 microns from the interface with the semiconductor member.

It is yet another object of the present invention to provide a new and improved method of epitaxially depositing a single-crystal semiconductor layer on a semiconductor substrate, which method is particularly attractive for use in the fabrication of high-speed semiconductor devices such as transistors.

It is an additional object of the invention to provide a new and improved method of epitaxially depositing, by the hydrogen reduction of a silicon halide, a single-crystal semiconductor layer on a semiconductor substrate having an impurity concentration profile greatly different from that of the layer.

It is also an object of the present invention to provide a new and improved intermediate structure in the fabrication of a semiconductor device.

In accordance with a particular form of the invention, the method of vapor depositing a crystalline semiconductor layer on a semiconductor member having a resistivity greatly different from that of the layer comprising intermittently introducing into a reaction chamber maintained at an elevated temperature and containing the aforesaid semiconductor member the vapor of a compound which liberates at the aforesaid temperature the semiconductor material of the layer and deposits it with a substantially constant resistivity beyond a few microns from the interface with the member.

Also in accordance with the invention, an intermediate structure in the fabrication of a semiconductor device comprises a crystalline semiconductor member, and a vapor-grown crystalline semiconductor layer on that member and having a resistivity which is greatly different from that of the member and is substantially constant beyond a few microns from the interface of that member.

The foregoing and other objects, features and advantages of the invention will be apparent from the following more particular description of a preferred embodiment of the invention, as illustrated in the accompanying drawing.

Figures 1, 2, 3:
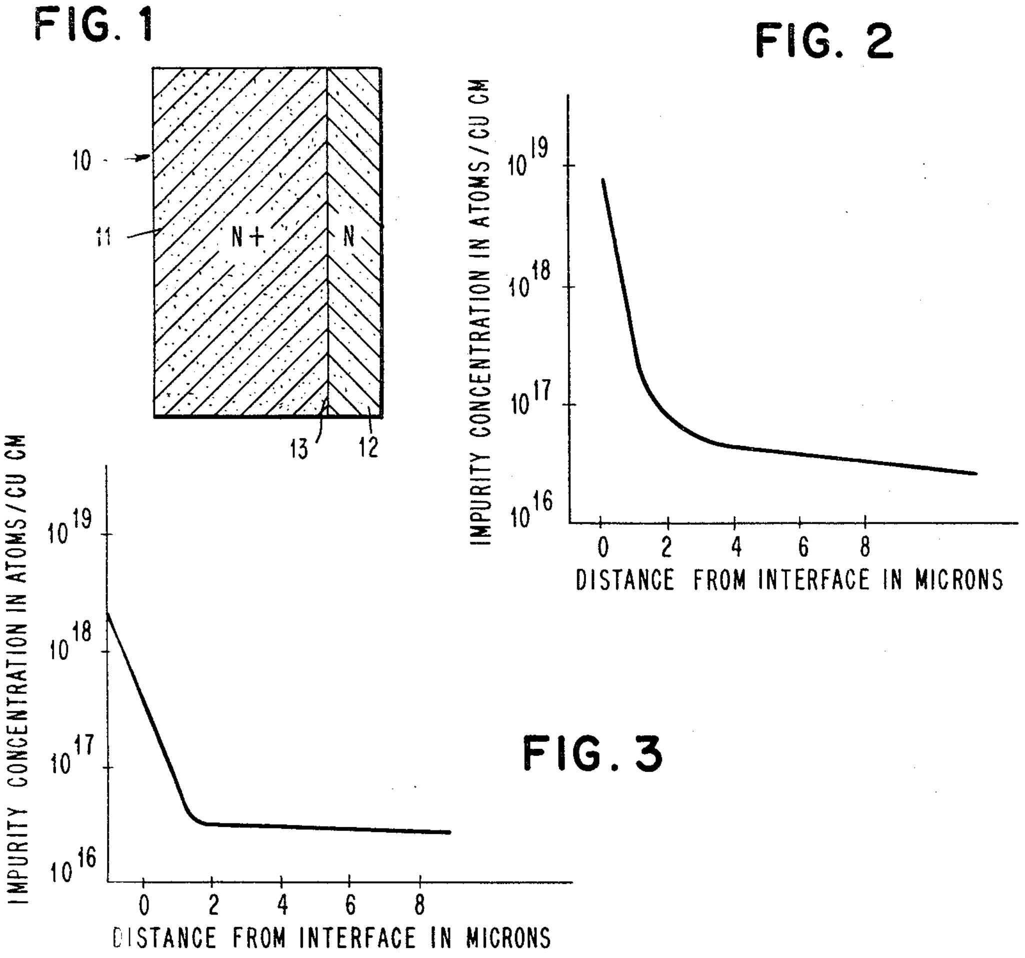
FIG. 1 is a sectional view of a semiconductor member or substrate which has a vapor-grown crystalline semiconductor layer thereon.
FIG. 2 is a curve representing a parameter of a FIG. 1 prior-art structure.
FIG. 3 is a similar curve for a FIG. 1 structure fabricated in accordance with the method of the present invention.

Referring now more particularly to FIG. 1 of the drawing, there is represented an intermediate structure 10 employed in the fabrication of a semiconductor device. That structure comprises a member or substrate 11 of a suitable crystalline semiconductor material such as silicon or germanium. For the purpose of the explanation which follows, member 11 will be considered as a single-crystal silicon semiconductor member rather than a polycrystalline one. Structure 10 includes also a vapor-grown crystalline semiconductor layer 12 on member 11 having a resistivity which is greatly different from that of the member. Since the member 11 is monocrystalline, layer 12 is an epitaxial one such that the silicon material thereof has the same atomic periodicity and orientation as member 11. In the fabrication of planar and mesa semiconductor devices, it is customary to employ an intermediate structure comprising a relatively thick member or substrate 11 having a low resistivity and a thin high-resistivity epitaxially deposited layer 12 thereon, usually of the same semiconductor material as the substrate. Accordingly, the intermediate structure 10 will be considered to be such a unit wherein subsequent successive masking and diffusing operations may be performed in connection with the epitaxial layer 12 to establish a pair of junctions and the collector, base and emitter regions of a transistor. These successive operations form no part of the present invention and are mentioned only for background purposes.

When the intermediate structure 10 is fabricated in accordance with the techniques of the prior art, the impurity concentration profile of the epitaxial layer measured from the interface 13 between the layer 12 and the member 11 has a shape similar to that represented by the curve of FIG. 2 when the donor impurity is antimony. This prior-art technique will be explained subsequently in connection with the operation of the apparatus of FIG. 4. It will be noted in FIG. 2 that the impurity concentration in the epitaxial layer is very high in the region less than 1 micron from the interface 13 where the concentration is about $10^{18}$ atoms per cubic centimeter, and decreases abruptly to $10^{17}$ units at 1 micron. The concentration thereafter decreases more slowly until about 6 microns beyond the interface is reached, when it then tends to level off somewhat at about 6 microns. Thus there is provided a fairly constant resistivity only after 6–8 microns of the epitaxial layer 12 are grown on the member 11. As a practical matter, in the fabrication of batches of the structure 10, it is difficult to realize profiles which consistently correspond to that represented in FIG. 2 despite careful fabrication control. Considerably poorer results are obtained when arsenic is the active impurity.

In the manufacture of semiconductor devices such as very high speed transistors, it is extremely desirable that the active impurity concentration in the epitaxial layer (and its related parameter resistivity) be substantially uniform as close to the interface 13 as possible. For many applications it is desirable that this uniformity occurs not more than a few microns, such as 1–4 microns, from the interface. Prior to the present invention it has not been possible consistently to obtain this characteristic on a production basis. If a substantially constant resistivity in the epitaxial layer can be realized consistently not more than, for example, 2 microns from the interface with the substrate rather than beyond 6 microns, a thinner epitaxial layer can be employed in the device and a faster device will result.

Referring now to FIG. 3, there is represented the impurity concentration profile for such an epitaxial layer which is fabricated on a substrate by the techniques of the present invention. It will be seen that the impurity concentration is somewhat greater than $10^{17}$ atoms per cubic centimeter at the interface 13, decreases abruptly to between $10^{16}$ and $10^{17}$ units at 1.5 microns and then becomes substantially constant where it remains through the rest of the thickness of the epitaxial layer. The manner in which this desirable profile is obtained in the layer will be explained hereinafter.

DESCRIPTION OF VAPOR-DEPOSITION APPARATUS OF FIG. 4

Figure 4:
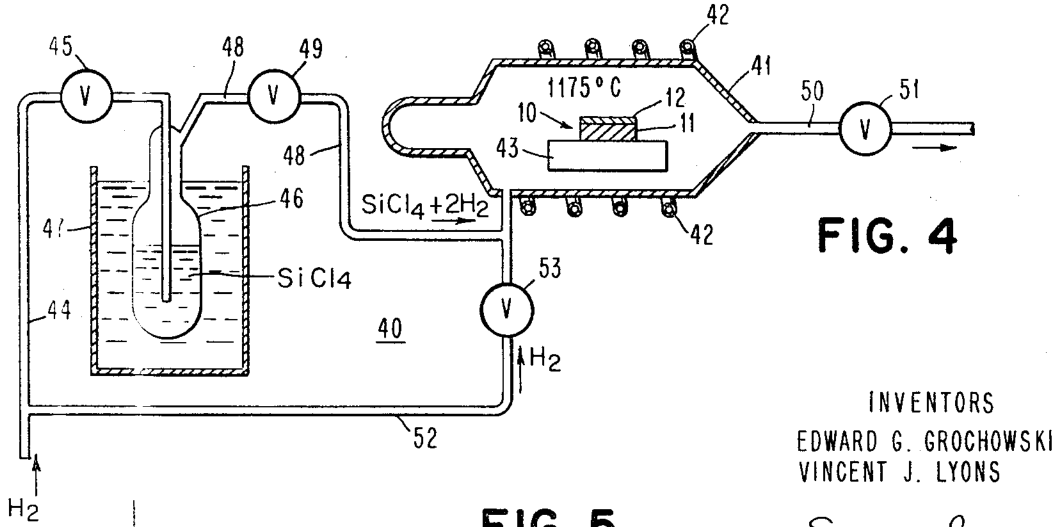
FIG. 4 is a representation of apparatus employed in practicing the method of the invention.

In FIG. 4 there is represented diagrammatically a vapor-deposition apparatus 40 which is of conventional construction but for one portion thereof. The apparatus includes a quartz reaction chamber 41 of known construction which is heated by a radio-frequency winding 42. Disposed within the chamber is a member 43 of a material such as carbon which supports the intermediate structure 10 of FIG. 1 and responds to the radio-frequency energy from winding 42 and develops an elevated temperature of about 1175° C. in the chamber. A reducing agent such as hydrogen gas is supplied by a conduit 44 through a valve 45 to a container 46 that is partially filled with a compound that is capable of liberating a semiconductor material under proper conditions at an elevated temperature. While various compounds may be employed for the purpose under consideration, silicon tetrachloride has proved to be particularly attractive for the epitaxial deposition of a silicon layer 12 on the member or substrate 11. To that end, liquid silicon tetrachloride is employed in the container 46 and, to assure consistent results, it is maintained at a substantially constant temperature by suitable means represented diagrammatically as a liquid filled vessel 47. A conduit 48 and a valve 49 supply a controlled vapor concentration of hydrogen and silicon tetrachloride to the reaction chamber 41. An exhaust conduit 50 and a valve 51 control the flow of exhaust gases from the reaction chamber. The vapor-deposition apparatus 40 features a by-pass conduit 52 and a valve 53 connected between one end of the conduit 44 and the inlet to the reaction chamber 45 for permitting operation of the apparatus in accordance with the method of the invention.

OPERATION OF APPARATUS OF FIG. 4

In considering the operation of the apparatus of FIG. 4, it will be assumed that the intermediate structure 10 is resting on the supporting member 43 as represented in FIG. 4, the radio-frequency winding 42 has been energized to heat the reaction chamber 41 to a temperature of about 1175° C., and that a flow of a gaseous mixture of hydrogen and silicon tetrachloride has been established through the reaction chamber 41 for sufficient length of time by the closing of valve 53 and the opening of valves 45, 49 and 51. The silicon tetrachloride in the reaction chamber is reduced by the action of the heat and the hydrogen to produce silicon which is deposited epitaxially on the single-crystal member or substrate 11. The chemical reaction may be expressed as follows:

$$SiCl_4+2H_2 \rightleftarrows Si+4HCl$$

The epitaxial deposition involves the addition of semiconductor atoms or materials to the semiconductor substrate 11 in such a manner that the crystal orientation and periodicity of the substrate is maintained in the layer 12 as its thickness increases to a desired value.

It will presently be assumed that an uninterrupted epitaxial deposition is continuing in the reaction chamber in accordance with the technique of the prior art. Some of the active N-type impurity in the highly doped substrate 11 migrates into the growing epitaxial layer 12, and by a solid-vapor mechanism dopes that layer but creates a less highly doped region than exists in the substrate. Accordingly, the resistivity of the growing epitaxial layer is considerably higher than that of the substrate on which it is formed. When the N-type impurity and the substrate 11 is antimony, the impurity profile of the substrate may have the shape represented by the curve of FIG. 2. As would be expected, the impurity concentration is greatest nearer the interface 13 of the substrate 11 and the epitaxial layer 12 and decreases with the distance from the interface. While a precise understanding of the phenomenon which is taking place is not clearly understood, it is believed that the introduction of the silicon tetrachloride vapor into the reaction chamber with the hydrogen carrier and reducing gas establishes an initial reaction which removes a small layer of silicon from the substrate, referred to as etch-back, in order to form a steady-state vapor composition in the vicinity of the substrate surface. In removing silicon from the substrate, the active impurity in the removed silicon makes its appearance in the vapor in contact with the substrate. Some of the impurity is then redistributed in the growing silicon layer, thus providing the impurity concentration profile represented in FIG. 2. As previously stated, it is desirable for many device applications, such as in high-speed semiconductor devices, that the deposited semiconductor material have a substantially constant resistivity a short distance from the interface, such as a few microns from that interface and beyond. The prior-art technique just described does not consistently or reproducibly provide such a resistivity until a thickness of about 6–8 microns from the interface between the substrate and the epitaxial layer is reached.

It will now be assumed that the method of the present invention is being practiced and that the valve 53 is closed and valves 45, 49 and 51 are open and that a stream of the gaseous mixture of hydrogen and silicon tetrachloride has been passed through the reaction chamber for short intervals of time such as about a minute. To introduce intermittently into the reaction chamber 41 the gaseous mixture under consideration, the valves 45 and 49 are closed at a time such as about half a minute later at time $t_1$ in FIG. 5 and the by-pass valve 53 has been opened. This interrupts the flow of the hydrogen and silicon tetrachloride gaseous mixture and the flow of hydrogen is now diverted through the conduit 52 and valve 53 into the chamber 41. The hydrogen flow sweeps out or purges the gaseous mixture previously in the chamber 41. The flow of hydrogen is continued for about 5 minutes until time $t_2$ in FIG. 5. Then valve 53 is closed and valves 45 and 49 are opened once again. This terminates the flow of hydrogen through the by-pass conduit 52 and reestablishes the flow of the gaseous mixture of hydrogen and silicon tetrachloride into the reaction chamber 41 from the conduit 48. The flow of this mixture is maintained for a suitable period such as about 8.5 minutes until the time $t_3$.

Experience has indicated that when the reacting vapor or gaseous mixture in contact with the growing epitaxial layer 12 is removed by purging the reaction chamber 41 with a non-contaminating gas such as hydrogen after the growth of a very thin deposit on the substrate (such as that formed at time $t_1$), then a subsequent deposition (such as that occurring during the interval $t_2$–$t_3$) will produce an epitaxial layer in which the active impurity concentration is little affected by the substrate dopant. This is because the new or second etch-back will occur in the initial film deposit, which now has a lower impurity concentration than the original substrate. There results a much sharper impurity concentration profile for the epitaxial layer corresponding to the one represented in FIG. 3. After the epitaxial deposition cycle just mentioned has been completed, the intermediate structure 10 is removed from the reaction chamber 11.

It will be understood that while a representative epitaxial deposition cycle has been described above, other cycles may be employed depending upon the semiconductor material employed, the thickness of the epitaxial layer wanted, the resistivities of the substrate and the epitaxial layer and the profile desired. For some applications it may be desirable to repeat the fabrication cycle one or more times. Intermediate structures fabricated in accordance with the method of the present invention may have in the member or substrate 11 significant impurity concentrations in the range of $8\times10^{18}$ to $5\times10^{19}$ atoms per cubic centimeter while the epitaxial layer 12 thereon may have thicknesses such as in the 5–12 micron range and resistivities in the range of $8\times10^{14}$ to $2\times10^{17}$ atoms per cubic centimeter, the particular resistivity being substantially constant at a distance beyond about 2 microns from the interface with the substrate. An intermediate structure which has proved to be particularly useful in a high-speed transistor included a single-crystal N-type silicon semiconductor member having a significant impurity concentration of about $10^{19}$ atoms per cubic centimeter and an N-type silicon semiconductor epitaxial layer on that member having a significant impurity concentration which is substantially constant in the range of 2–8 microns beyond the interface with the member and which is about $10^{17}$ atoms per cubic centimeter in the range just mentioned.

Figure 5:
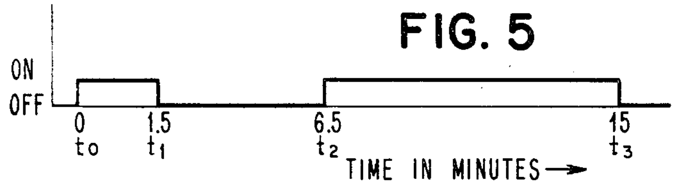
FIG. 5 is a graph employed in explaining the method of the present invention.

Fabricating or pulsing cycles other than that represented in FIG. 5 may also be employed. A gaseous mixture of hydrogen and silicon tetrachloride may be passed into the reaction chamber 41 during the interval $t_0$–$t_1$ which may have a duration of from about 0.5–5 minutes. A 5 minute purging interval $t_1$–$t_2$ wherein only hydrogen gas or some other suitable non-contaminating gas is passed into the reaction chamber has proved to be very adequate.

The last portion of the fabricating cycle occurring during the interval $t_2$–$t_3$ wherein the flow of the mixture of silicon tetrachloride and hydrogen is passed through the reaction chamber 41 may have a duration of from about 4–12 minutes. In the fabrication of N-type intermediate structures such as that represented in FIG. 1, an interval $t_0$–$t_1$ having a duration of about 0.5–1.5 minutes has proved to be practical, while the interval $t_2$–$t_3$ having a duration of about 5–6 minutes has also proved to be very satisfactory. Excellent intermediate structures of N-type silicon wherein the epitaxial layer had a thickness of about 5 microns have been fabricated when the time interval $t_0$–$t_1$ was 1.5 minutes, the interval $t_1$–$t_2$ was 5 minutes and the interval $t_2$–$t_3$ was about 8.5 minutes, the flow of the various gases being in the manner previously described.

While the invention has been particularly shown and described with reference to a preferred embodiment thereof, it will be understood by those skilled in the art that various changes in form and details may be made therein without departing from the spirit and scope of the invention.

What is claimed is:

1. The method of epitaxially depositing a semiconductor layer of one conductivity type on a single crystal semiconductor substrate of the same conductivity type having a greatly lower resistivity than that of said layer comprising:

passing during a first time interval into a reaction chamber maintained at an elevated temperature and containing said member, the vapor of a composition which liberates at said temperature the semiconductor material of said layer and deposits it on said member;

interrupting the passage of said vapor and removing it from the chamber during a second time interval; and, re-establishing the passage of said mixture during a third time interval to redeposit said layer whereby said layer has a substantially constant resistivity beyond about two microns from the interface with said member, said constant resistivity being higher than the resistivity of the initially deposited portion.

2. The method of claim 1 wherein said composition comprises a semiconductor halide.

3. The method of claim 2 wherein said composition comprises a gaseous mixture of hydrogen and silicon tetrachloride, said tetrachloride being simultaneously reduced at said elevated temperature during said passage to liberate the silicon.

4. The method of claim 3 wherein said first time interval is from about 0.5 to 5 minutes, said second time interval is about 5 minutes, and said third time interval is from about 4 to 12 minutes.

5. The method of claim 1 wherein said semiconductor substrate is of N type conductivity and the deposited semiconductor layer is of N type conductivity and has a substantially constant resistivity beyond about three microns from said interface.

References Cited

UNITED STATES PATENTS

| | | | |
|---|---|---|---|
| 3,168,422 | 2/1965 | Allegretti et al. ---- | 148—175 |
| 3,170,825 | 2/1965 | Schaarschmidt ------ | 148—175 |
| 3,172,791 | 3/1965 | Allegretti et al. ----- | 148—175 |
| 3,189,494 | 6/1965 | Short --------- | 148—174 XR |
| 3,208,888 | 9/1965 | Ziegler et al. ------- | 148—175 |
| 3,243,323 | 3/1966 | Corrigan et al. --- | 156—17 XR |

L. DEWAYNE RUTLEDGE, Primary Examiner

W. G. SABA, Assistant Examiner

U.S. Cl. X.R.

117—106, 201; 148—1.5